(12) United States Patent
Kennedy et al.

(10) Patent No.: US 6,617,946 B2
(45) Date of Patent: Sep. 9, 2003

(54) MICROWAVE PACKAGE

(75) Inventors: John D. Kennedy, Nashua, NH (US); Jeffrey A. Scorse, Leominster, MA (US)

(73) Assignee: Skyworks Solutions, Inc., Irvine, CA (US)

( * ) Notice: Subject to any disclaimer, the term of this patent is extended or adjusted under 35 U.S.C. 154(b) by 0 days.

(21) Appl. No.: 09/760,502

(22) Filed: Jan. 12, 2001

(65) Prior Publication Data

US 2001/0032740 A1 Oct. 25, 2001

Related U.S. Application Data

(60) Provisional application No. 60/175,843, filed on Jan. 13, 2000.

(51) Int. Cl.[7] .................................................. H01P 3/08
(52) U.S. Cl. ........................................ 333/246; 333/247
(58) Field of Search ................................ 333/246, 247; 257/728; 361/768, 752; 174/262

(56) References Cited

U.S. PATENT DOCUMENTS

| | | | | |
|---|---|---|---|---|
| 4,821,007 A | * | 4/1989 | Fields et al. | 333/238 |
| 5,408,053 A | * | 4/1995 | Young | 174/264 |
| 5,450,046 A | * | 9/1995 | Kosugi et al. | 333/246 |
| 5,650,760 A | * | 7/1997 | Degun et al. | 333/246 |
| 6,163,233 A | * | 12/2000 | Adkins | 333/1 |
| 6,178,311 B1 | * | 1/2001 | Pance et al. | 455/78 |
| 6,249,439 B1 | * | 6/2001 | DeMore et al. | 361/752 |

* cited by examiner

Primary Examiner—Robert Pascal
Assistant Examiner—Joseph Chang
(74) Attorney, Agent, or Firm—Bromberg & Sunstein LLP

(57) ABSTRACT

A surface mount package for a microwave circuit is disclosed. The package has a port for transferring a signal from the microwave circuit to a printed circuit board. The package includes a base made from a dielectric material which includes vias which contain a conductive material and are electrically coupled to the ground potential of the printed circuit board. Conductive material is placed on the topside of the base forming a transmission line for carrying the signal in a transmission line mode. To facilitate operation in a transmission line mode, the length of the transmission line is a substantial portion of the wavelength of the signal. The transmission line provides electrical contact with a terminal of the microwave circuit and is electrically coupled to the port. Additionally, the transmission line forms an electromagnetic wave guiding structure. In one embodiment, the electromagnetic wave guiding structure operates in both grounded coplanar waveguide and microstrip mode where a second conductive material resides on the top side of the base and spaced a distance from the first conductive material. In such a configuration, a portion of the base separates the first and second conductive materials, and the second conductive material substantially surrounds the first conductive material of the transmission line.

38 Claims, 10 Drawing Sheets

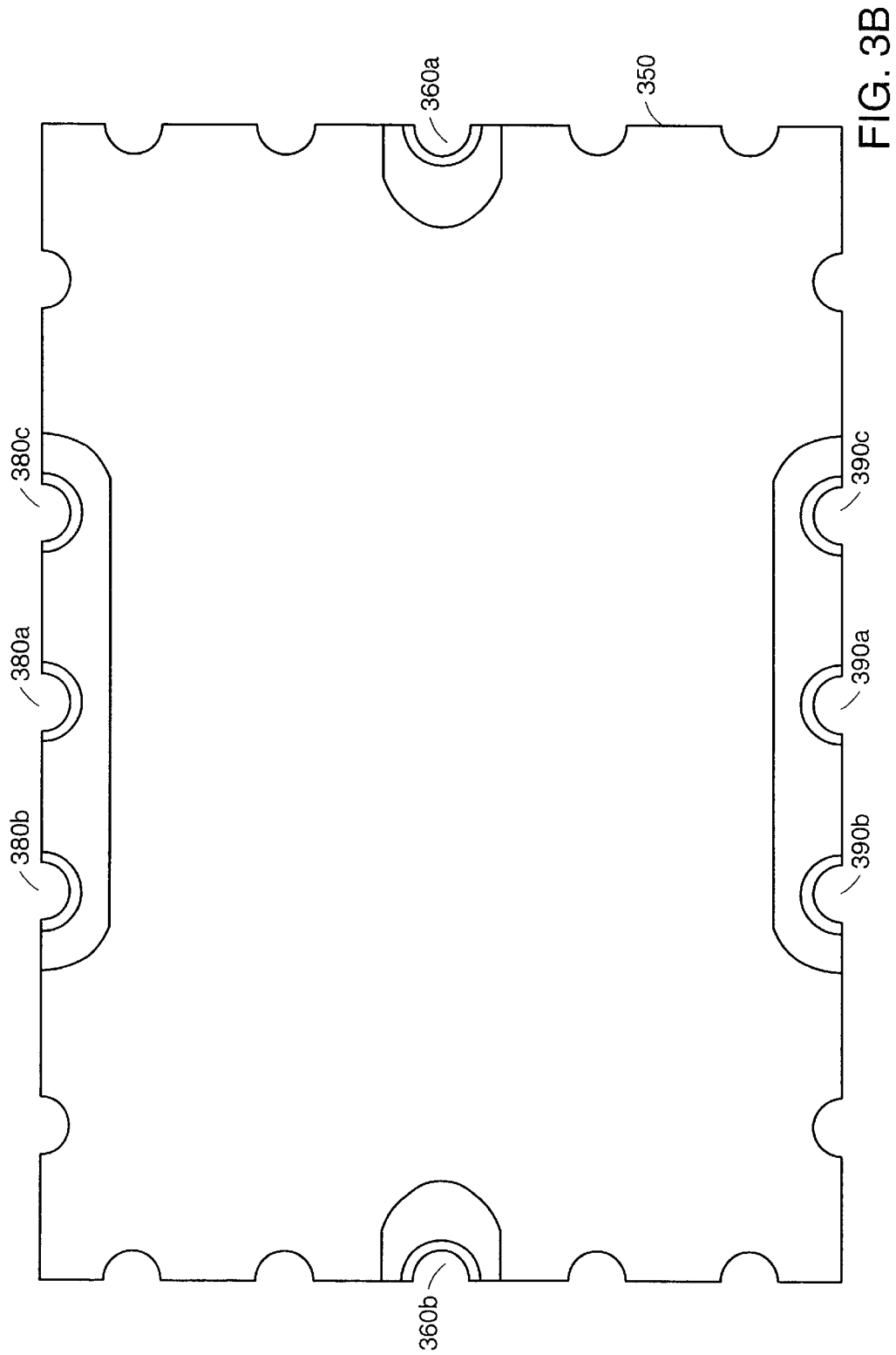

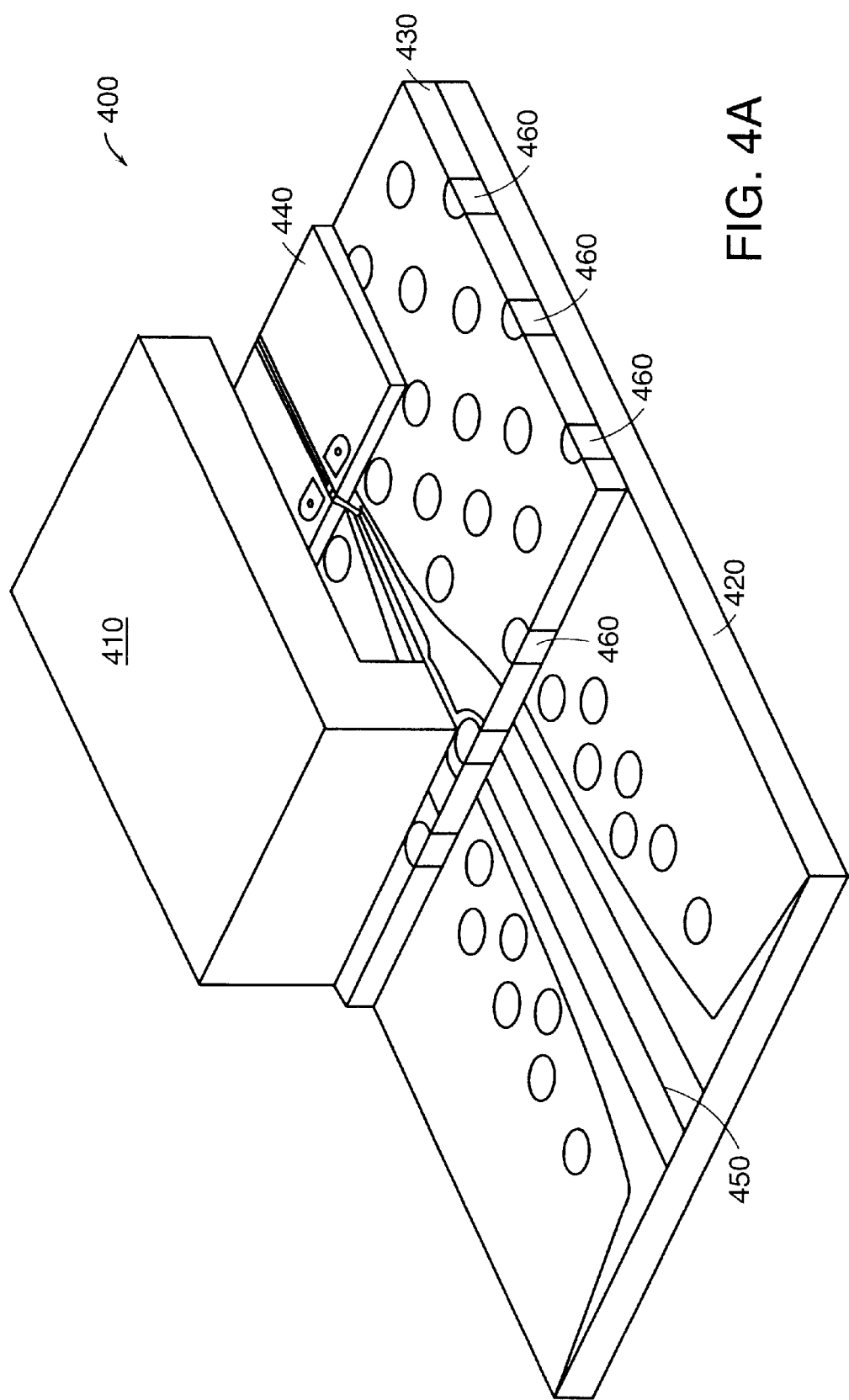

MICROWAVE PACKAGE

PRIORITY

This application claims priority from U.S. provisional patent application serial No. 60/175,843 filed Jan. 13, 2000, entitled "Microwave Package," bearing attorney docket number 1920/104, the disclosure of which is incorporated herein by reference in its entirety.

TECHNICAL FIELD

The present invention relates to electronic devices and more particularly to packaging for electronic devices.

BACKGROUND ART

Semiconductor electronic devices often include a package surrounding the device to permit handling by a user such that only a very isolated portion of the device is exposed to external environmental influences and usually this exposed portion is only the contact points for electrical coupling including: input, output, biasing, and signaling connections. Packages are typically manufactured out of plastic, metal, ceramic or glass.

For circuits that operate in the gigahertz and above frequency range, the package has additional constraints including that the package must be designed so as not to cause performance limitations. If not constrained, electric signals that operate at microwave frequencies are directed as waves in all directions causing a loss in the signal which is, proportional to the wavelength of the signal. Additionally, these waves can feedback into the signal path causing distortion to the signal. Without careful design, high return losses occur and therefore special consideration must be paid toward the propagation of the signal in the package.

SUMMARY OF THE INVENTION

A surface mount package for a microwave circuit is disclosed. The package has a port for transferring a signal from the microwave circuit to a printed circuit board. The package includes a base made from a dielectric material. Conductive material is placed on the topside of the base forming a transmission line for carrying the signal in a transmission line mode. To facilitate operation in a transmission line mode, the length of the transmission line is a substantial portion of the wavelength of the signal. The transmission line provides electrical contact with a terminal of the microwave circuit and is electrically coupled to the port, wherein the port partially defines the bottom side of the package. Additionally, the transmission line forms an electromagnetic wave guiding structure. In one embodiment, the electromagnetic wave guiding structure operates in grounded coplanar waveguide mode. In one alternative embodiment, the electromagnetic wave guiding structure operates in microstrip mode. In another embodiment, the electromagnetic wave guiding structure operates in both grounded coplanar waveguide and microstrip mode where a second conductive material resides on the top side of the base and spaced a distance from the first conductive material. In such a configuration, a portion of the base separates the first and second conductive materials, and the second conductive material substantially surrounds the first conductive material of the transmission line.

In one embodiment, the second conductive material is displaced from a first portion of the transmission line by a first distance so that the transmission line operates in grounded coplanar waveguide mode and by a second distance along a second portion of the transmission line so that the transmission line operates in microstrip mode along the second portion.

Additionally, there are a plurality of vias in the base. Each via is filled with a conductive material and the vias both direct the signal from the package to the microwave circuit and block propagation of the signal to prevent feedback of the signal to the microwave circuit. In one embodiment, the vias are all electrically coupled to a common ground. In such an embodiment, there are a sufficient number of vias to provide a substantial grounding of the base so that the signal does not feedback into the signal path. In another embodiment, the vias are spaced less than a quarter wavelength apart.

Another element to the package is a cover which resides on the base and encloses the microwave circuit. The microwave circuit is enclosed in such a way that the signal in its electromagnetic form is allowed to propagate in a controlled manner within the package. The cover is preferably made from a material which shares a similar thermal expansion coefficient to the base.

In an alternative embodiment, at least one bonding pad is provided for electrically coupling at least one terminal of the microwave circuit. In an embodiment in which there are a plurality of bonding pads, the bonding pads provide contact points for DC biasing the microwave circuit.

In yet another embodiment the base includes a conductively coated output castellation formed on the side of the base and the castellation defines the port of the package. In yet another variation, the conductive material residing in the output castellation electrically couples the transmission line to the printed circuit board.

BRIEF DESCRIPTION OF THE DRAWINGS

The foregoing features of the invention will be more readily understood by reference to the following detailed description taken with the accompanying drawings:

FIG. 3B is a bottom view of the base of the package.

FIG. 4A shows an isometric view of a package including part of a cover and a printed circuit board.

DETAILED DESCRIPTION OF SPECIFIC EMBODIMENTS

In the following description and the appended claims the term "surface mount" implies that one side of the package lies flush with a printed circuit board. The flush surface of the package does not have solder balls as in a ball grid array. In the following description and accompanying claims the term "microwave" shall be defined as an electromagnetic wave having a wavelength between 1 mm and 30 cm corresponding to frequencies between 300 GHz and 1 GHz. The term "castellation" shall refer both to its traditional meaning which is that of a semi-circular cutout of an object, but shall also refer to any cutout shape and is not limited to a semi-circular cut.

Figure 1:
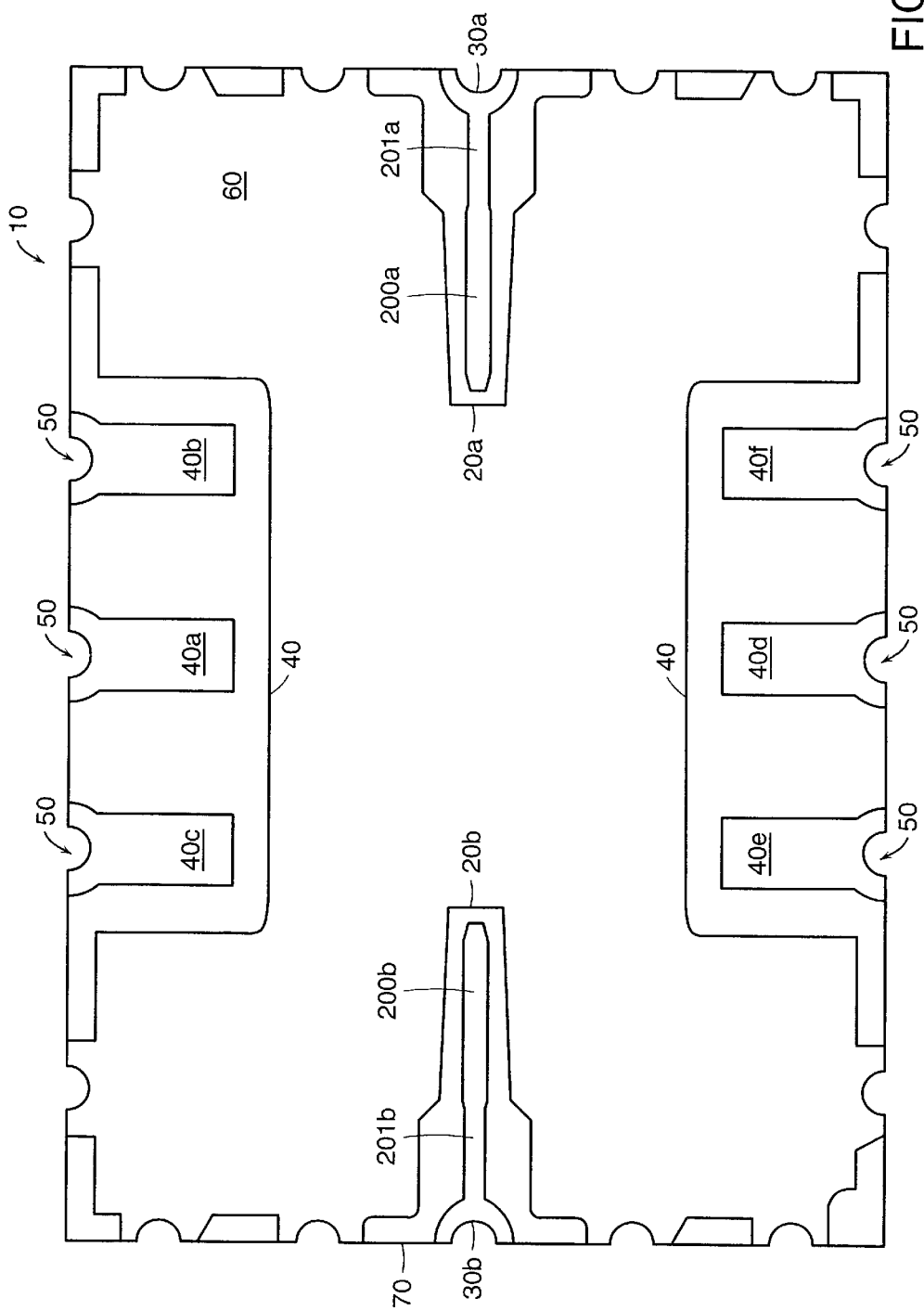
FIG. 1 is an overhead view of a base of a package for holding a microwave circuit or monolithic microwave integrated circuit.

In FIG. 1 is shown an overhead view of the top of a base 10 of a surface mount package for holding a microwave circuit or monolithic microwave integrated circuit. The package is designed to reduce both the input and the output return loss and maintain the gain for the integrated circuit so that a high percentage of the signal is transmitted in the signal path. The package maintains impedance matching at the transitions over all frequencies where the transitions are between the microwave circuit, the package and the printed circuit board. The preferred impedance is matched to the industry standard 50 ohms. Impedance matching assists in reducing loss of the signal and also increases isolation preventing feedback.

In an embodiment, the base 10 is a ceramic. In preferred embodiments, the base 10 is constructed from alumina or aluminum nitride. A ceramic is chosen since it may be molded to a uniform thickness and smoothed so that high precision metalized patterns may be screened on the material. Additionally, ceramics are a low loss tangent dielectric and posses a dielectric constant which is greater than that of air. It should be understood by one of ordinary skill in the art that the base may also be made out of other ceramics such as beryllium oxide, as well as various forms of alumina ($Al_2O_3$) such as HTCC (high temperature cofired ceramic) and LTCC (low temperature cofired ceramic). Further, the base may be made out of other types of dielectric material such as glass-, plastic-, epoxy- or PTFE-based materials or laminated microwave materials such as glass reinforced hydrocarbon/ceramic laminate or PTFE laminates.

The package is constructed to fit on a preprinted circuit board that is created in conjunction with the package so that the inputs, outputs, DC biasing signals and ground connections are in alignment with similar connections on the circuit board when the package is placed on the circuit board. The package includes both the shown base 10 and a cover (not shown) wherein the cover encloses the microwave circuit, but is designed so that the cover is separated from the microwave circuit by a pocket of air for controlled wave transmission as will be explained below.

In the configuration that is shown in FIG. 1 the top of the base 10 is configured to accept an integrated circuit thereon. The configuration is such that the integrated circuit has an input port for receiving a microwave input signal and an output port for transmitting a microwave output signal. Additionally, the base is configured so that the microwave integrated circuit may be DC (direct current) biased. When the microwave circuit is attached to the top side of the base 10, the input and the output ports of the microwave circuit are connected to metalized strips 20 which extend to the edges of the base. The metalized strips at both the input 20a and the output 20b of the microwave circuit form transmission lines and in another embodiment the transmission lines operate solely in micro-strip mode. As such, the transmission lines serve the purpose of an electromagnetic wave guiding structure. In one embodiment, the transmission lines operate in both grounded coplanar waveguide mode over a first portion of the transmission line and in microstrip mode over a second portion of the transmission line. In another embodiment, the transmission lines are solely grounded coplanar transmission lines. At the edge of the base, where the transmission lines end, castellations 30 are found. Each castellation 30 is a semicircular cutout of the base material which extends through the entire base material and which is metalized. Although the embodiment that is shown has only one input castellation 30a and one output castellation 30b, this should not be considered a limitation and more than one input castellation, output castellation, and transmission line may be provided for a microwave circuit that requires more than one input or output. The input and output castellations 30 create transition points for the signal wherein the signal is redirected from the top side, down the castellation, and onto the circuit board on which the base sits. In such a fashion, a signal may be directed from the circuit board (not shown) up the input castellation 30a from the bottom of the base to the top across the input transmission line 20a into the input port of the microwave circuit (not shown), through the microwave circuit and then from the output port of the microwave circuit across the output transmission line 20b transitioning down the output castellation 30b to the bottom of the base and onto the circuit board. The microwave circuit is mechanically coupled to the base by one of any number of mechanical bonding techniques including either conductive epoxy die attach with silver fill or other metal filled epoxy or solder die attach using gold-tin, gold germanium or tin lead combinations.

Bonding pads 40 for the microwave circuit are also found on the top surface. The microwave circuit may be attached to the bonding pads for direct current (DC) biasing of the microwave circuit. At the edge of the bonding pads are DC biasing edge castellations 50. These castellations are metalized and provide an electrical coupling between the base and the printed circuit board. In FIG. 1 there are three DC biasing edge castellations shown on the upper and lower edges of the top surface of the base. Castellations 40a, 40b, 40c, 40d, 40e, 40f provide paths for transmitting voltage differentials across the microwave circuit. The microwave circuit may be connected to the bonding pads 40 through any of a number of bonding techniques known in the art, such as, wire bonding and the bonding pads may be configured in accordance with the configuration of the microwave circuit that is being used. Forms of wire bonding include ball bonding using thermal or sonic compression or some combination thereof or wedge bonding using thermal and sonic compression. The microwave circuit may also be connected to the signal path through ribbon bonding such as wedge bonding or gap weld bonding. Further, the connection between the microwave circuit and the signal path may be achieved through flip chip bonding.

The top surface of the base is coated with a metal layer 60 providing a planar ground for the top surface. The metalized layer 60 of the top surface creates a ground that substantially surrounds the transmission lines as shown in FIG. 1. The metal layer also substantially covers the top surface of the base which prevents any stray portion of the signal from feeding back into the signal path. The base dielectric material 70 is exposed between the metalized layer of the signal carrying transmission lines 20a and 20b and the metalized layer 60 providing a planar ground. The configuration of the transmission lines 20, the planar ground 60, and the exposed dielectric base material 70 allows the package to operate in a transmission mode when a signal is passed through the package. In a preferred embodiment, at a first section 200a of the transmission line 20a, the planar ground 60 is separated from the transmission line 20a by approximately the width of the transmission line on both sides. This allows the signal to operate in grounded coplanar waveguide mode. At the second section 201a of the transmission line 20a, the spacing of the grounded metalization 60 layer increases and is greater than two times the width of the second section 201a of the transmission line. This configuration of the second section 201a of the transmission line and ground 60 allows the package to operate in microstrip mode. Microstrip mode is used near the edge castellations 30a, since co-planar wave guide mode requires three substantially parallel metalized properly spaced strips and this configuration cannot be maintained at the transition point of the castellation. This configuration of the transmission line occurs at both the input and the output of the microwave circuit such that transmission line 20b exhibits the same properties as transmission line 20a. It should be understood that metals such as gold, silver, copper, platinum, palladium, nickel, titanium and tungsten may be used for metalization of the base for both the transmission lines and the planar ground.

For the transmission lines 20a, 20b to function properly in either coplanar mode or microstrip mode, the conductive material forming the transmission line must have an aspect ratio in which the length of the transmission line is substantially longer than the width and in which the transmission line's length is a substantial fraction of the signal's wavelength. Additionally, the spacing of the transmission lines 20a, 20b from the planar ground 60 for microstrip mode is a distance which is greater than the thickness of the base so that the electric field which is created on the top terminates on the back of the base.

Figure 2A:
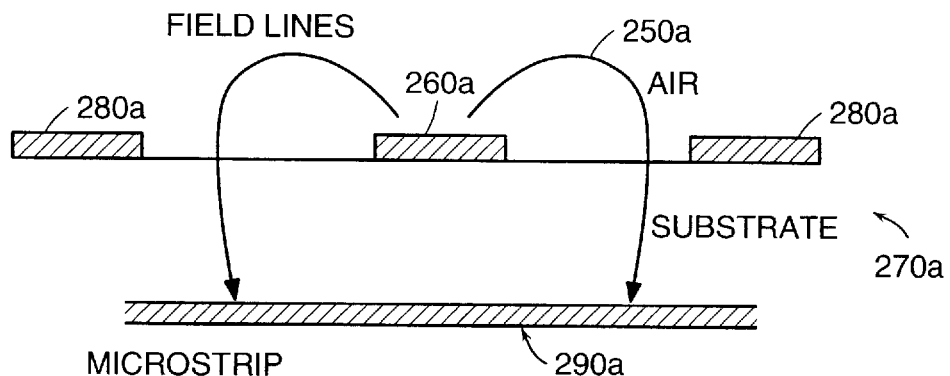
FIGS. 2A and 2B show a side view of the base of the package including the electric field lines which are generated as a microwave signal passes along the transmission line on the top of the base.
Figure 2B:
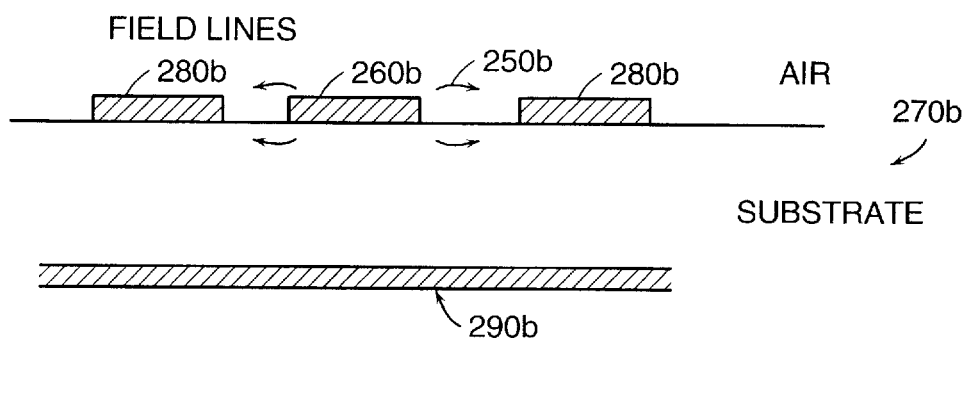

FIGS. 2A and 2B show a side view of the base of the package including the electric field lines 250a and 250b which are generated as a microwave signal passes along the transmission lines 260a and 260b on the top of the bases 270a and 270b. In FIG. 2A, when the grounded metalized material 280a on the top surface is at a distance which is greater than the thickness of the base 270a, the electric field 250a seeks the lowest potential which is closest to the transmission line 260a. In this Fig., ground 290a is located on the back of the base. This mode of operation is known as microstrip mode. In FIG. 2B, when the metalized ground 280b is spaced at a distance which is less than the width of the base 270b, the electric fields 250b are drawn to the ground metalization 280b on the top of the base 270b keeping the electric field 250b essentially in the plane of the top of the base 270b. This mode of operation is known as grounded coplanar waveguide. In both modes of operation the electric fields are controlled rather than let to propagate through the package and potentially feedback into the signal path.

Figure 3A:
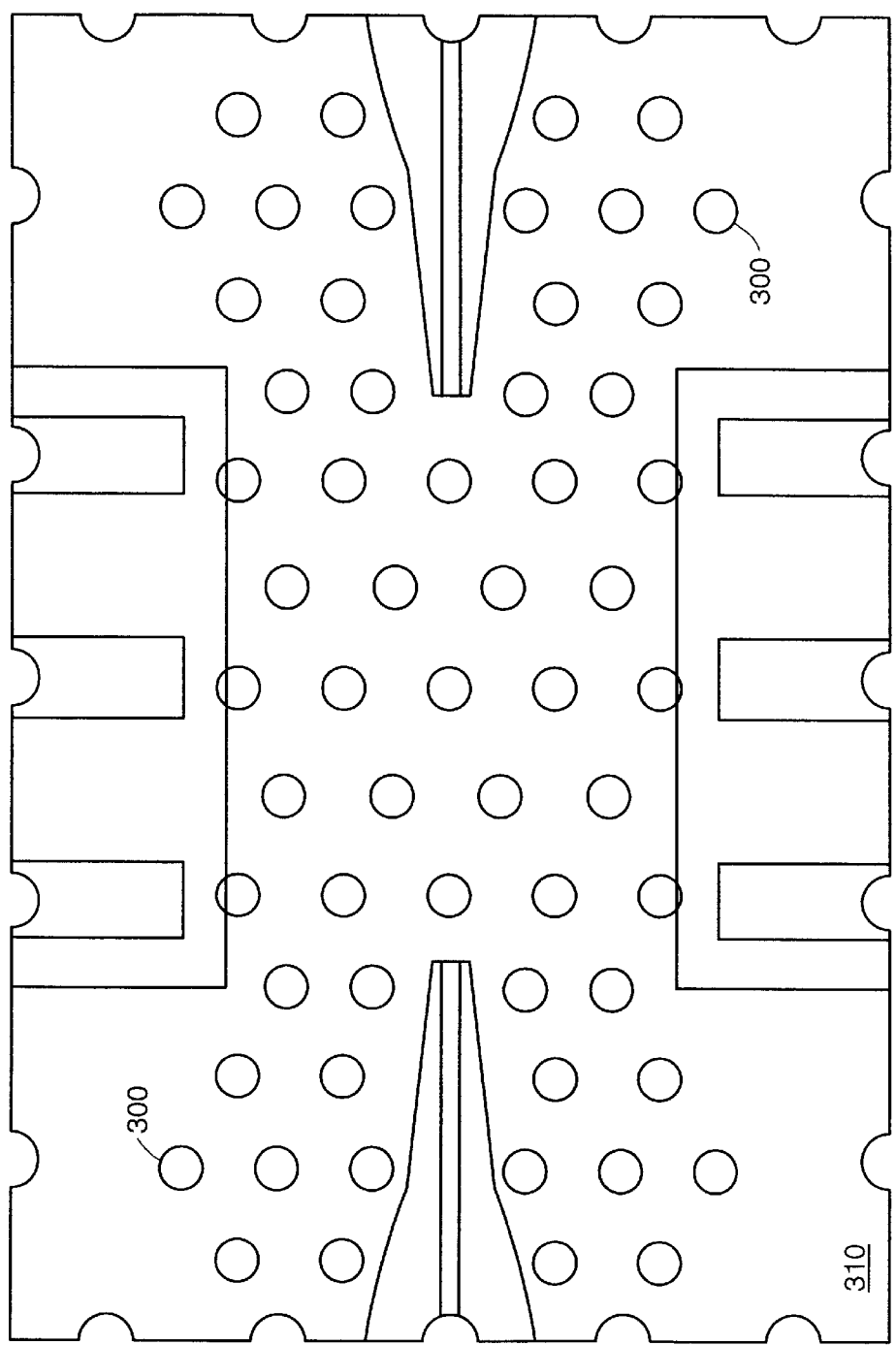
FIG. 3A shows a top view of the base of the package with the grounding metalization removed.

FIG. 3A shows a top view of the base of the package with the grounding metalization removed. The dielectric base has a multitude of vias 300. Each via 300 is filled with an electrically conductive material and the vias 300 are each connected to ground. In the preferred embodiment, the vias 300 extend through the entire base 310 to the bottom of the base. On the bottom side is another metalization layer which connects all of the vias together and is connected to ground. The plurality of metal filled vias 300 provides a grounded "fence" so that the signal does not propagate through the dielectric base and may be arranged in a two dimensional array. For example, propagation occurs as the signal transitions between the top and the side of the package to the circuit board. The vias 300 are spaced at a distance apart so that substantially all of the signal that enters the package at the transition points is grounded and is therefore not fed back into the signal path to cause distortion. The spacing for the vias is approximately the length associated with one-quarter of the wavelength of the signal. The vias may be filled with metal such as tungsten or another refractory metal or another metal such as copper, silver, gold, platinum, palladium, and nickel.

A bottom view of the base of the package is shown in FIG. 3B. FIG. 3B shows an embodiment in which substantially all of the bottom of the base is metalized 350. The bottom side of the base lies flush with the printed circuit board and provides a common ground for all of the vias in the base and to the planar ground on the top surface. By substantially metalizing and grounding the bottom 350 of the base, the signal cannot propagate into the printed circuit board thereby retaining the signal within the package. The bottom also shows the metalization of the input and output castellations 360a, 360b, as well as, the bonding pad castellations 380a, 380b, 380c, 390a, 390b, 390c.

Figure 3C:
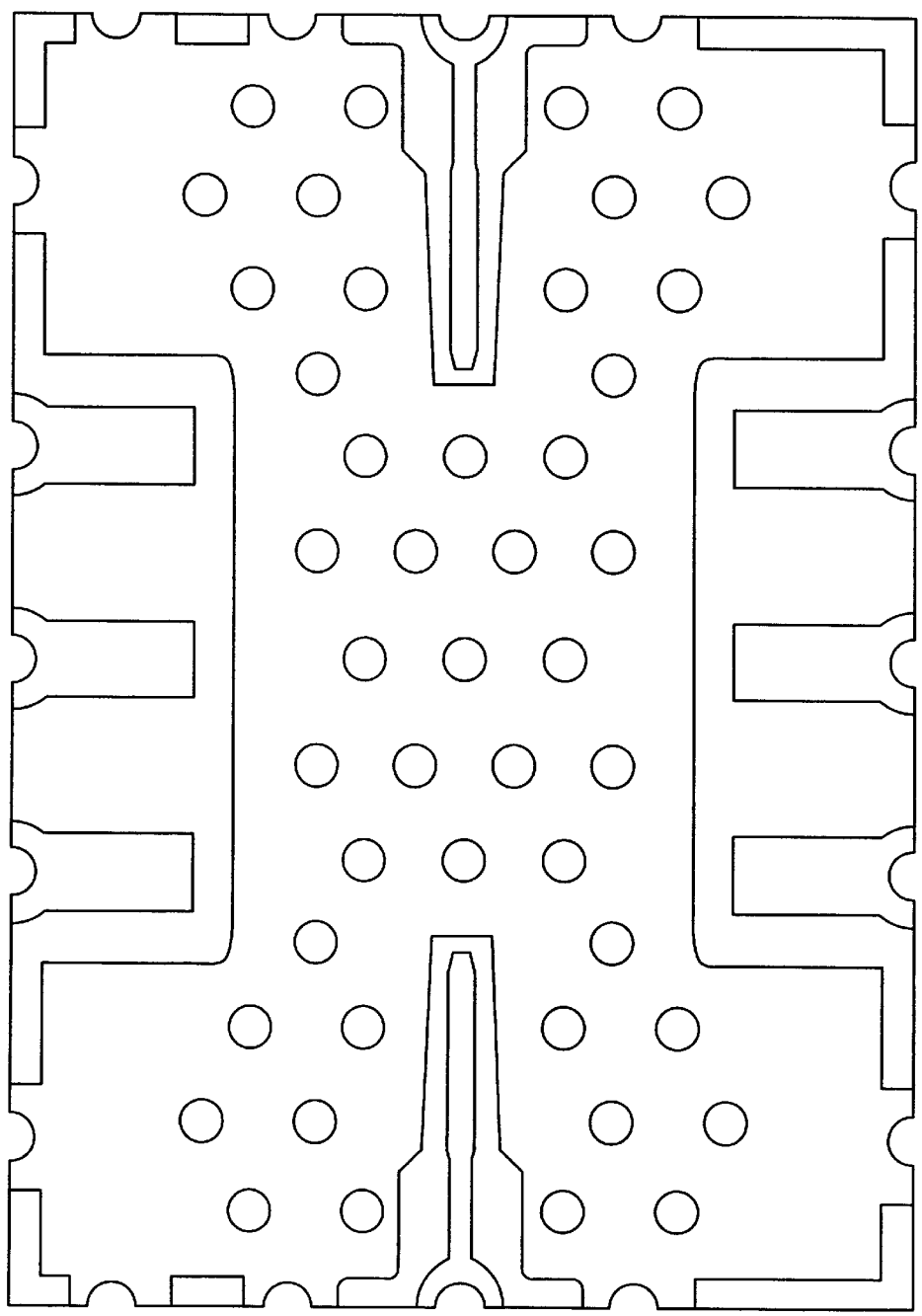
FIG. 3C is a top view of the base in a different configuration from that of FIG. 3A

FIG. 3C is an alternative embodiment of the base to that of FIG. 3A. Near the edge castellation the transmission lines flare out providing a greater area for the transmission line similarly the distance between planar ground and the transmission line increases, but not enough to switch the mode of operation. In such a configuration the transmission line operates almost entirely in co-planar waveguide mode with the vertical surface of the castellation being the only point where the package operates in microstrip mode.

FIG. 4A shows an isometric view of a package including part of a cover 410 and a printed circuit board 420. It should be noted that the package possesses a symmetrical design divided between input and output. As a result, only ½ of the package base 430 is shown and ½ of the integrated microwave circuit 440 which resides on top of the base 430. Additionally, it should be noted that only ¼ of the cover 410 is shown. In the preferred embodiment, the cover 410 is made of a material which has the same co-efficient of thermal expansion as the base material. The cover 410 of the package facilitates handling of the microwave integrated circuit so that the circuit and the bonding do not get damaged. The cover 410 also prevents direct exposure to the environment, so that, for example, moisture does not get into the circuit or signal path. It should be understood by those of ordinary skill in the art that the lid is preferably made from alumina or any other material that the base is constructed from, but may also be made from multiple materials, such that the cover may be partially metal and partially alumina for example. The lid may be attached to the base by epoxy such as b-stage epoxy, preform epoxy or dispensed epoxy.

The base 430 of the package is placed on the printed circuit board 420 in a predesignated position as the package 400 and the circuit board 420 are constructed in complementary fashion. As can be seen in FIG. 4A, the printed circuit board 420 is constructed with transmission lines 450 for maintaining the microwave signal in grounded coplanar mode. In this embodiment, the base 430 is secured to the printed circuit board 420 by applying solder to the metalized edge castellations 460. As such, the solder bonds to metal that is positioned on the printed circuit board 420 and to the metal in the castellations 460 providing a secure attachment of the base 430 to the printed circuit board 420. In the preferred embodiment, the process is carried out for all of the edge castellations 460 including the input, output, ground and bonding pad castellations.

Figure 4B:
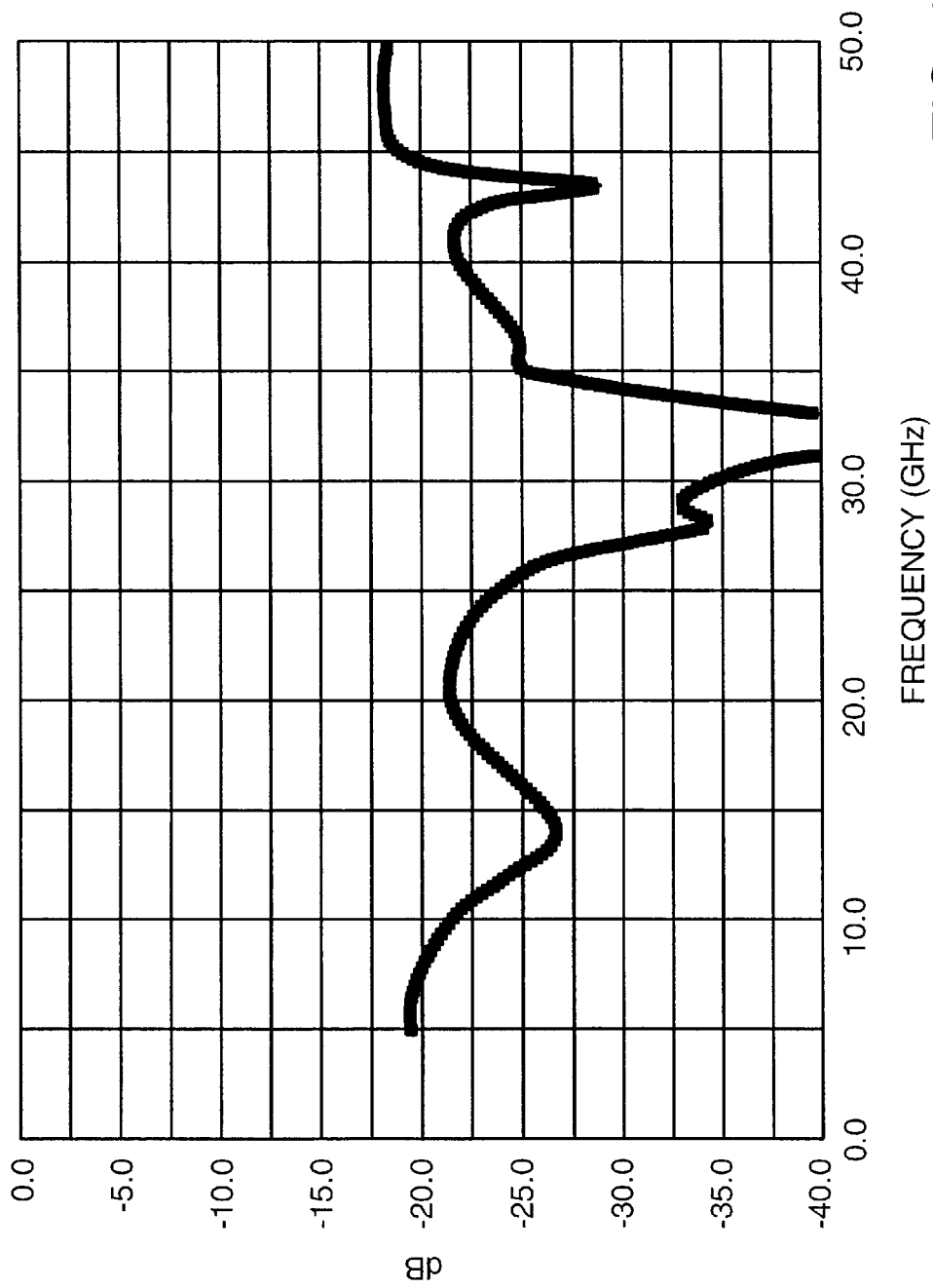
FIG. 4B is a graph simulation of the input return loss of the package over a frequency range of 0 to 50 GHz.

FIG. 4B is a graph simulation of the input return loss of the package. Over frequencies between 0.001 GHz and 50

GHz, the input return loss is below −17 dB. In the range between 20 and 40 GHz the input return loss is never above −20 dB. As a result the package is not lossy and is applicable for use with microwave circuits which are sensitive to noise and perturbations such as a low noise amplifier or any circuit that is placed before a low noise amplifier in the signal path.

Figure 5:
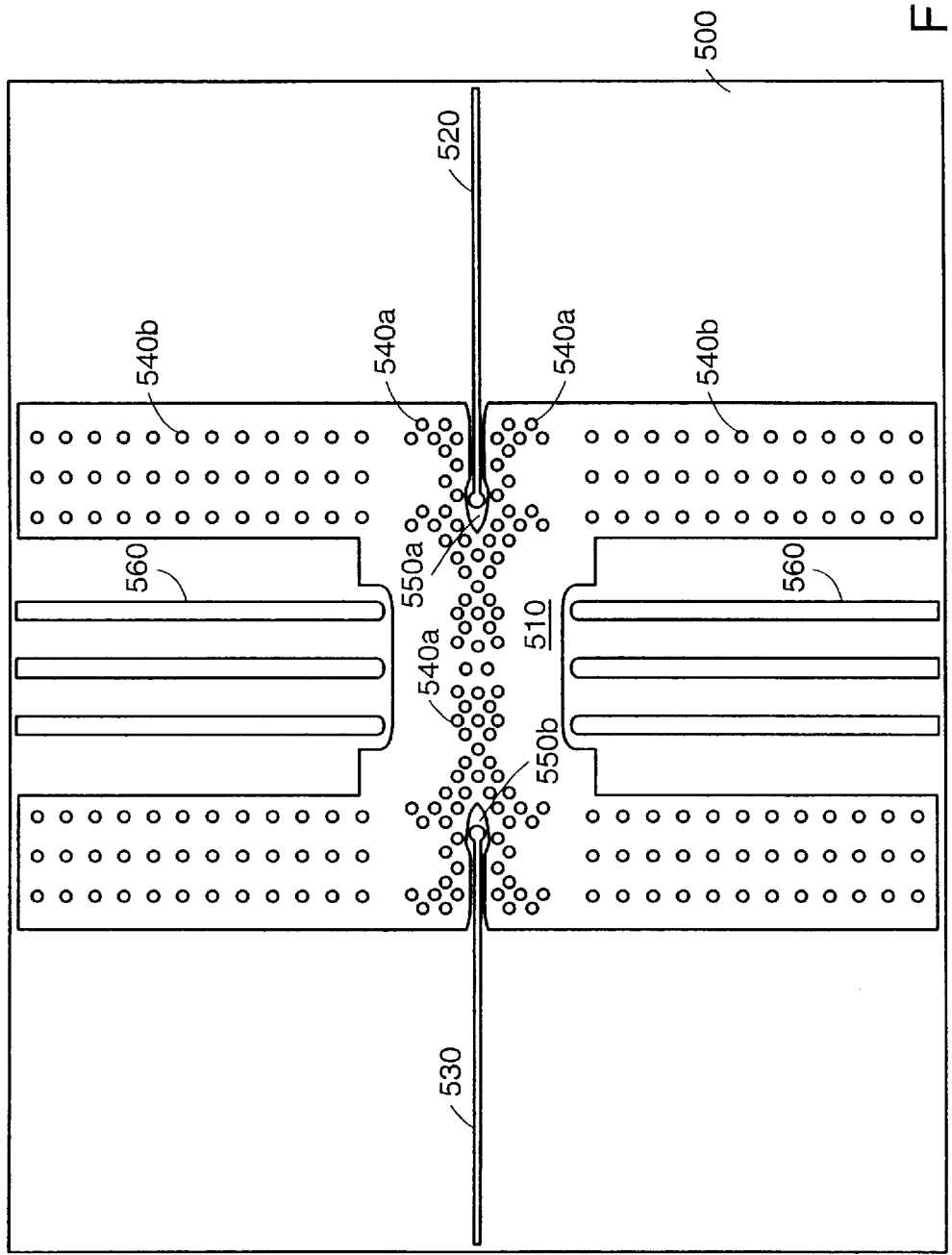
FIG. 5 is a partial view of the printed circuit board.

FIG. 5 is a view of a section of the printed circuit board 500. As should be obvious to one of ordinary skill in the art, the presented circuit board 500 could be duplicated and connected so that multiple microwave integrated circuits could be connected together to create a more complex circuit. Additionally, the circuit board need not be duplicated at all, but rather a single board could be created for holding multiple integrated circuits.

The package encasing the integrated circuit (not shown) is placed centrally 510 on the board so that the input and output castellations align with an input metalized strip 520 and an output metalized strip 530 respectively. The input and output metalized strips 520, 530 provide electromagnetic wave guiding structures for the signal for connecting the package to the external environment or another circuit board. As should be understood by one of ordinary skill in the art, the structures on the printed circuit board which connects the signal(s) to the external environment can be grounded coplanar or microstrip transmission lines.

A multitude of metal filled vias 540 are placed into the circuit board. Each of the vias 540 is grounded. In one embodiment, the vias 540 extend through the printed circuit board 500 where the bottom of the circuit board is completely metalized and connected to ground, thus creating a common ground for all of the vias 540. Multiple vias 540a are placed in close proximity to the input and output castellation positions 550a, 550b. These vias 540a provide the same functionality as the vias in the package, preventing the signal from propagating through the circuit board 500 and into the package. To prevent propagation while maintaining the rigidity of the board, the vias are separated from each other by a distance that is approximately less than one-quarter wavelength of the signal. Additional vias 540b are used and in the embodiment of FIG. 5 are placed into a grid configuration. These vias 540b provide a grounding mechanism for all DC currents, as a result, these vias need not be in close proximity as is required for the other vias. These DC vias are not required to be placed into a specific pattern. Metalized strips 560 are also provided which align with the castellations for the bonding pads and provide the DC connections from the package to the external environment.

Figure 6A:
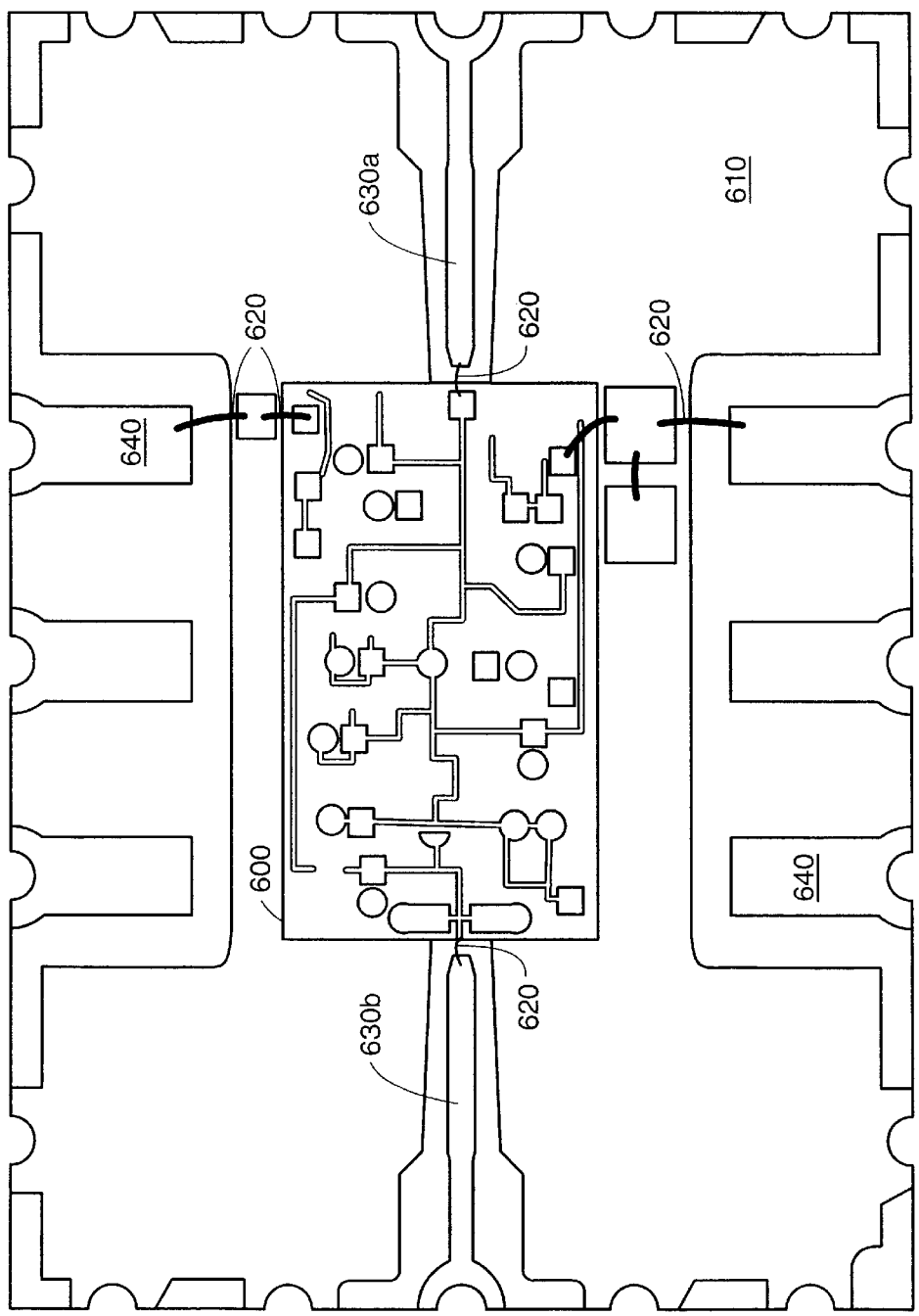
FIG. 6A is an overhead view of a microwave integrated circuit mounted on a base of a package.
Figure 6B:
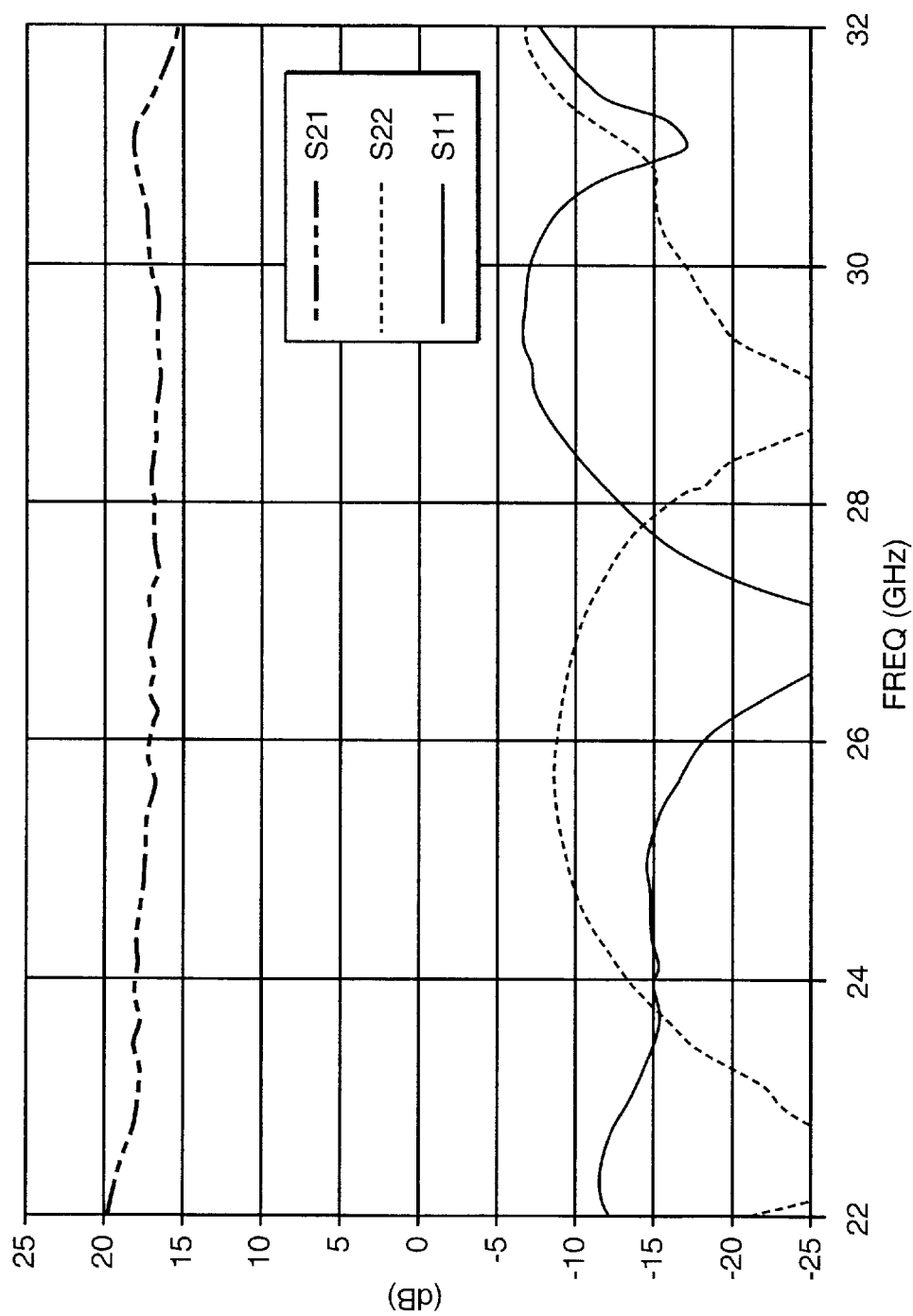
FIG. 6B shows a graph of the input return loss, the output return loss and the gain over frequencies for 22 GHz to 32 GHz for the microwave integrated circuit and the package of FIG. 6A.

FIG. 6A shows an overhead view of a microwave integrated circuit 600 mounted on a base 610 of a package. Ribbon bonds 620 connect the microwave integrated circuit 600 to the input and output metalization strips 630a, 630b and to the bonding pads 640. FIG. 6B shows a graph of $S_{11}$, the input return loss, $S_{22}$, the output return loss and $S_{21}$ the gain from input to output over frequencies for 22 GHz to 32 GHz for the microwave integrated circuit and the package and the printed circuit board of FIG. 6A.

The input return loss, also called the input reflection coefficient, is the microwave power reflected from the input port divided by the microwave power incident on the input port. FIG. 6B shows the input return loss to be below −7 dB over the entire frequency range.

The output return loss, also called the output reflection coefficient, is the microwave power reflected from the output port divided by the microwave power incident on the output port. FIG. 6B shows the output return loss to be below −8 dB over the entire frequency range.

The gain, also called the forward transmission coefficient, is the microwave power delivered to a matched load at the output port divided by the microwave power incident on the input port. FIG. 6B shows the gain is above 17 dB over the entire frequency range.

This graph demonstrates that the physical layout of the above described package maintains the signal within the signal path without substantial loss.

Although various exemplary embodiments of the invention have been disclosed, it should be apparent to those skilled in the art that various changes and modifications can be made which will achieve some of the advantages of the invention without departing from the true scope of the invention. These and other obvious modifications are intended to be covered by the appended claims.

We claim:

1. A surface mount package for a microwave circuit, the surface mount package permitting communication of a signal between a printed circuit board and the microwave circuit defining a signal path, the package comprising:

a base having a first side and a second side, the second side for surface mounting to the printed circuit board;

a port on the base for permitting communication of the signal between the microwave circuit and the printed circuit board;

a transmission line located on the first side for carrying the signal in a transmission line mode, the transmission line providing electrical coupling with a terminal of the microwave circuit and the port; and a set of vias in the base, wherein each via includes a conductive material wherein the set of vias are arranged to prevent propagation of a radiated portion of the signal in the base back into the signal path.

2. The package according to claim 1, wherein the vias are all electrically coupled to a common ground.

3. The package according to claim 1, wherein the transmission line is an electromagnetic wave guiding structure.

4. The package according to claim 3, wherein the electromagnetic wave guiding structure operates in grounded coplanar waveguide mode.

5. The package according to claim 3, wherein the electromagnetic wave guiding structure operates in microstrip mode.

6. The package according to claim 3, wherein the electromagnetic wave guiding structure operates in both grounded coplanar waveguide and microstrip mode.

7. The package according to claim 6, further comprising a conductive material residing on the first side spaced from the transmission line, wherein a portion of the base separates the conductive material and the transmission line and the conductive material covers the vias providing a ground on the first side.

8. The package according to claim 7, wherein the conductive material substantially surrounds the transmission line.

9. The package according to claim 7, wherein the conductive material is displaced from the first conductive material so that the transmission line operates in grounded coplanar waveguide mode.

10. The package according to claim 8, wherein the conductive material is displaced from a first portion of the transmission line by a first distance so that the transmission line operates in grounded coplanar waveguide mode and by a second distance along a second portion of the transmission line so that the transmission line operates in microstrip mode.

11. The package according to claim 1, further comprising:
at least one bonding pad for electrically coupling at least one terminal of the microwave circuit wherein the bonding pad resides on the first side.

12. The package according to claim 1, further comprising:
a plurality of bonding pads wherein the bonding pads provide contact points for DC biasing the microwave circuit.

13. The package according to claim 1, wherein the vias are spaced less than a quarter wavelength apart.

14. The package according to claim 1, wherein the vias are spaced in a two dimensional array.

15. The package according to claim 1, wherein there are a sufficient number of vias to provide a substantial grounding of the base so that the signal does not feedback into the signal path.

16. The package according to claim 1, wherein the base has a third side adjoining the first and second sides and the port is an output castellation formed on the third side wherein conductive material resides within the output castellation and is electrically coupled to the terminal of the microwave circuit.

17. The package according to claim 16, wherein the conductive material residing in the output castellation electrically couples the transmission line to the printed circuit board.

18. The package according to claim 1, wherein the base is made from a dielectric.

19. The package according to claim 18, wherein the dielectric is a ceramic.

20. The package according to claim 1, wherein in the second side is configured to reside on a printed circuit board where the second side has an electrically coupled ground point for contacting to a ground on the circuit board.

21. The package according to claim 20, wherein the second side is substantially metalized and electrically coupled to the vias and to a metalized planar ground on the first side such that the substantially metalized second side, the vias, and the metalized planar ground are at the same potential as ground of the circuit board.

22. The package according to claim 1, further comprising:
a cover for covering the microwave circuit wherein the cover allows for propagation of the signal within the cover.

23. The package according to claim 22, wherein the cover is at least partially composed of metal.

24. A surface mount package for a microwave integrated circuit, the package comprising:
a base having a first side and a second side, the first side receiving the microwave integrated circuit, the second side being surface mountable to a circuit board;
a wave guide for carrying a signal on the base, the wave guide electrically coupling an output of the microwave integrated circuit to a signal path on the circuit board; and
a set of vias residing within the base wherein the vias include a conductive material that provides a ground to prevent feedback of the signal through the base to an input of the microwave integrated circuit.

25. A surface mount package for a microwave integrated circuit, the microwave circuit having an input and an output for carrying a signal, the package comprising:
a base having a first side for receiving the microwave integrated circuit and a second side opposed to the first side, the base further having a third side connecting the first and second sides, the first side defined by an input edge and an output edge, a portion of the third side forming an input edge castellation, the second side being adapted for mounting to a circuit board wherein the signal is received at the input edge castellation;
a conductive material residing partially on the first side forming a wave guide from the input edge castellation to a point on the first side where the input of the microwave integrated circuit is received; and
a plurality of vias extending through the base positioned to block propagation of the signal through the base to the output of the microwave integrated circuit.

26. A surface mount package for a microwave integrated circuit, the microwave circuit having input and an output for carrying a signal, the package comprising:
a base having a first side for receiving the microwave integrated circuit and a second side opposed to the first side, the base further having a third side connecting the first and second sides, the first side having an input edge and an output edge, the second side being adapted for mounting to a circuit board;
a conductive material residing on the first side forming an electromagnetic wave guiding structure from the input edge to a point on the first side where the input of the microwave integrated circuit is received, the conductive material also positioned on the base so as to electrically couple the first side and the second side so that the signal may be transmitted from the circuit board to the input of the microwave integrated circuit; and
a plurality of vias extending through the base positioned to block propagation of the signal to an output of the microwave integrated circuit.

27. A surface mount package for a microwave integrated circuit operating on a signal, the integrated circuit having at least one input and at least one output, the package comprising:
a base having a top and a bottom and at least one side wherein the top is adapted to receive an integrated circuit;
the top having a metalized waveguide for coupling the input of the integrated circuit to the side of the base;
the top having a metalized waveguide for coupling the output of the integrated circuit to the side of the base;
the side of the base being partially metalized for transitioning the signal from the bottom of the base to the metalized waveguide coupled to the input of the integrated circuit;
the side of the base being partially metalized for transitioning the signal from the bottom of the base to the metalized waveguide coupled to the output of the integrated circuit;
a cover connected to the base enclosing the integrated circuit;
vias in the base spaced to prevent substantially all of the signal from feeding back into the integrated circuit; and
connection receiving means for connecting the surface mount package to a circuit board.

28. The surface mount package according to claim 27, wherein the top of the base is substantially metalized and electrically coupled to the vias creating a grounding plane on the top of the base;
wherein the grounding plane substantially surrounds the waveguide coupled to the output and the waveguide coupled to the input without being electrically coupled to the waveguides.

29. The surface mount package according to claim 27, wherein the bottom of the base is substantially metalized and coupled to ground on the circuit board.

30. The surface mount package according to claim 29, wherein the bottom of the base which is substantially metalized is conductively coupled to the planar ground on the top of the base through the vias.

31. The surface mount package according to claim 27, wherein the waveguides operates as coplanar waveguides.

32. The surface mount package according to claim 27, wherein the waveguides operate in microstrip mode.

33. The surface mount package according to claim 27, wherein the waveguides have an associated length operating in coplanar waveguide mode over a first portion of the length of the waveguide and in microstrip mode over a second portion of the length of the waveguide.

34. The surface mount package according to claim 27, wherein the circuit board is configured for receiving the surface mount package.

35. The surface mount package according to claim 27, wherein the cover is made of a material having a thermal coefficient substantially similar to the base.

36. A surface mount package for a microwave circuit, the surface mount package permitting communication of a signal between a printed circuit board and the microwave circuit defining a signal path, the package comprising:
 a base having a first side and a second side, the second side for surface mounting to the printed circuit board;
 a port on the base accessible from the second side for permitting communication of the signal between the transmission line and the printed circuit board;
 a transmission line located on the first side for carrying the signal in a transmission line mode, the transmission line providing electrical coupling with a terminal of the microwave circuit and the port; and
 a set of vias in the base, wherein each via includes a conductive material wherein the set of vias are arranged to prevent propagation of a radiated portion of the signal in the base back into the signal path.

37. A surface mount package for a microwave integrated circuit, the package comprising:
 a base having a first side and a second side, the first side receiving the microwave integrated circuit, the second side being surface mountable to a circuit board;
 a wave guide on the first side of the base for carrying a signal from an output of the microwave integrated circuit to a port;
 wherein the port provides electrical communication between the wave guide on the first side to the second side of the base and to the circuit board; and
 a set of vias residing within the base wherein the vias include a conductive material that provides a ground to prevent feedback of the signal through the base to an input of the microwave integrated circuit.

38. A surface mount package for a microwave circuit, the surface mount package permitting communication of a signal between a printed circuit board and the microwave circuit defining a signal path, the package comprising:
 a base having a first side and a second side, the second side for surface mounting to the printed circuit board;
 a port on the base accessible from the second side for permitting communication of the signal between the transmission line and the printed circuit board;
 a transmission line located on the first side for carrying the signal in a transmission line mode, the transmission line providing electrical coupling with a terminal of the microwave circuit and the port; and
 a set of grounding vias in the base, wherein each via includes a conductive material wherein the set of vias at least reside underneath a position on the base where the microwave circuit is to be mounted.

* * * * *